(12) United States Patent
Jeong et al.

(10) Patent No.: US 10,679,691 B2
(45) Date of Patent: Jun. 9, 2020

(54) SEMICONDUCTOR SYSTEM INCLUDING A COUNTING CIRCUIT BLOCK

(71) Applicant: SK hynix Inc., Icheon-si Gyeonggi-do (KR)

(72) Inventors: Seung Gyu Jeong, Gwangmyeong-si Gyeonggi-do (KR); Do-Sun Hong, Icheon-si Gyeonggi-do (KR); Su Hae Woo, Icheon-si Gyeonggi-do (KR); Chang Soo Ha, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/203,350

(22) Filed: Nov. 28, 2018

(65) Prior Publication Data

US 2019/0348103 A1    Nov. 14, 2019

(30) Foreign Application Priority Data

May 11, 2018    (KR) .......................... 10-2018-0054340

(51) Int. Cl.
| | |
|---|---|
| *G11C 16/04* | (2006.01) |
| *G11C 11/4072* | (2006.01) |
| *G11C 11/408* | (2006.01) |
| *G11C 8/04* | (2006.01) |
| *G11C 16/08* | (2006.01) |
| *G11C 16/24* | (2006.01) |
| *G11C 8/18* | (2006.01) |

(52) U.S. Cl.
CPC ............ *G11C 11/4072* (2013.01); *G11C 8/04* (2013.01); *G11C 8/18* (2013.01); *G11C 11/4087* (2013.01); *G11C 16/0483* (2013.01); *G11C 16/08* (2013.01); *G11C 16/24* (2013.01); *G11C 2211/5644* (2013.01)

(58) Field of Classification Search
CPC ... G11C 11/4072; G11C 11/4087; G11C 8/04; G11C 16/24; G11C 16/0483; G11C 16/08; G11C 2211/5644
USPC .................................................... 365/185.03
See application file for complete search history.

(56) References Cited

U.S. PATENT DOCUMENTS

| | | |
|---|---|---|
| 9,805,827 B2 | 10/2017 | Son et al. |
| 2017/0077100 A1* | 3/2017 | Takahashi ............. H01L 45/085 |

(Continued)

*Primary Examiner* — Huan Hoang
(74) *Attorney, Agent, or Firm* — William Park & Associates Ltd.

(57) ABSTRACT

A semiconductor system may include a memory device and a controller. The memory device may include a plurality of decks. Each of the decks may include word lines and bit lines alternately stacked. The controller may control an operation for data of the decks included in the memory device. The controller may include a counting circuit block for counting access numbers of the word lines and the bit lines. The counting circuit block may include a plurality of x-counting blocks corresponding to the word lines that are stacked a plurality of y-counting blocks corresponding to the bit lines that are stacked. The x-counting blocks may count access numbers of selected word lines in accordance with a selection signal of a corresponding deck among the decks. The y-counting block may count access numbers of selected bit lines in accordance with the selection signal of the corresponding deck.

19 Claims, 7 Drawing Sheets

(56) References Cited

U.S. PATENT DOCUMENTS

2017/0140807 A1* 5/2017 Sun ..................... G11C 29/023
2017/0192911 A1   7/2017 Castro et al.

* cited by examiner

SEMICONDUCTOR SYSTEM INCLUDING A COUNTING CIRCUIT BLOCK

CROSS-REFERENCES TO RELATED APPLICATION

The present application claims priority under 35 U.S.C. § 119(a) to Korean application number 10-2018-0054340, filed on May 11, 2018, in the Korean Intellectual Property Office, which is incorporated herein by reference in its entirety.

BACKGROUND

1. Technical Field

Various embodiments may generally relate to a semiconductor system, and more particularly, to a semiconductor system including a counting circuit block.

2. Related Art

As requirements of a memory device having high capacity and low power consumption, next-generation memory devices with non-volatile characteristics without periodic refreshes may be developed. The next-generation memory devices may require a high integration of a dynamic random access memory (DRAM), the non-volatile characteristics of a flash memory and a rapid speed of a static RAM (SRAM).

The next-generation memory devices may include a phase changeable RAM (PCRAM), a nano floating gate memory (NFGM), a polymer RAM (PoRAM), a magnetic RAM (MRAM), a ferroelectric RAM (FeRAM), a resistive RAM (ReRAM), etc.

The PCRAM may include a switching element and a storage element at intersected points between a word line and a bit line. Thus, a memory cell array structure of the PCRAM may be referred to as a cross point array structure.

The next-generation memory device may also require a high integration. In order to meet the above-mentioned requirement, a stacked memory cell structure including the word lines and the bit lines alternately stacked may be proposed.

SUMMARY

In examples of embodiments of the present disclosure, a semiconductor system may include a memory device and a controller. The memory device may include a plurality of decks. Each of the decks may include word lines and bit lines alternately stacked. The controller may control a read operation and a write operation for data of the decks included in the memory device. The controller may include a counting circuit block for counting access numbers of the word lines and the bit lines. The counting circuit block may include a plurality of x-counting blocks corresponding to the word lines that are stacked and a plurality of y-counting blocks corresponding to the bit lines that are stacked. The x-counting blocks may count access numbers of selected word lines in accordance with a selection signal of a corresponding deck among the decks. The y-counting block may count access numbers of selected bit lines in accordance with the selection signal of the corresponding deck.

In examples of embodiments of the present disclosure, a semiconductor system may include a first deck, a second deck and a counting circuit block. The first deck may include a plurality of first word lines, a plurality of first bit lines, and a plurality of first memory cells arranged at intersected points between the first word lines and the first bit lines. The second deck may be arranged over the first deck. The second deck may include the first bit lines, a plurality of second word lines, and a plurality of second memory cells arranged at intersected points between the first bit lines and the second word lines. The counting circuit block may include a first x-counting block, a second x-counting block 232 and a y-counting block. The first x-counting block may count access numbers of the first word lines in response to a first selection signal for selecting the first deck. The second x-counting block may count access numbers of the second word lines in response to a second selection signal for selecting the second deck. The y-counting block may count access numbers of the first bit lines in response to the first and second selection signals.

In examples of the embodiments of the present disclosure, a counting circuit block may include x-counting blocks and y-counting blocks. The x-counting blocks may include x-counters that may correspond to a number of word lines that are stacked. The y-counting blocks may include y-counters that may correspond to a number of bit lines that are stacked and the bit lines may be interposed between the word lines. When the bit lines are shared by two decks, the y-counting block may count access numbers of the bit lines in response to two deck selection signals.

DETAILED DESCRIPTION

Various embodiments will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The embodiments are described herein with reference to cross-section and/or plan illustrations of idealized embodiments. However, embodiments should not be construed as limiting the concepts. Although a few embodiments will be shown and described, it will be appreciated by those of ordinary skill in the art that changes may be made in these embodiments without departing from the principles and spirit of the present disclosure.

Figure 1:
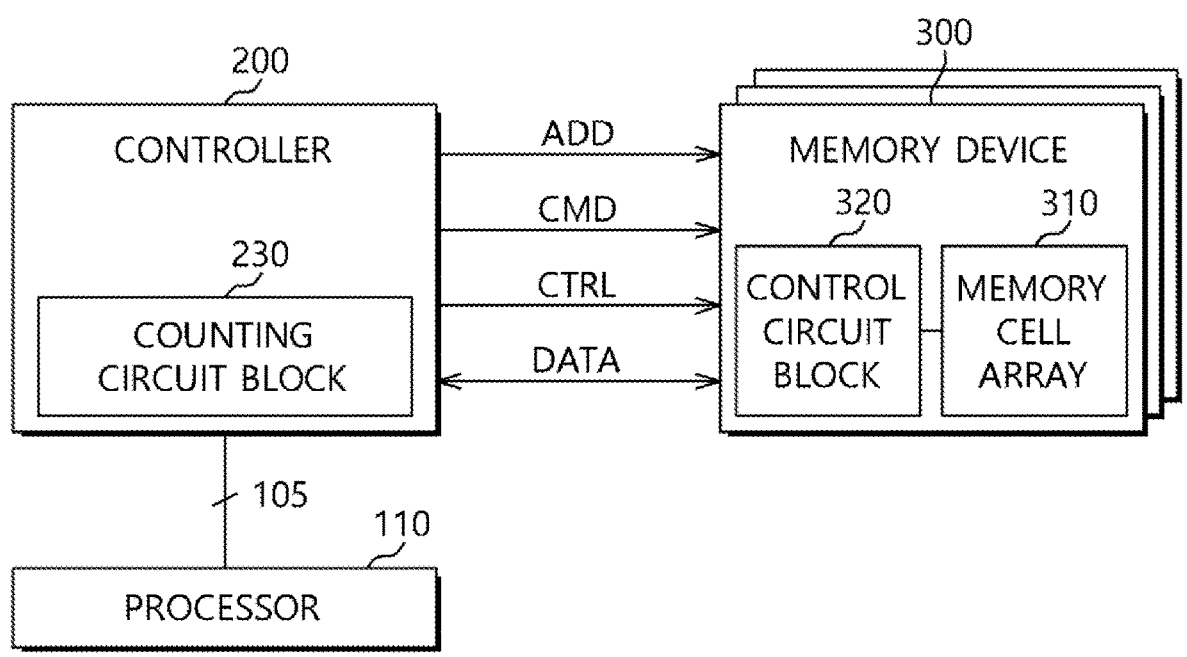
FIG. 1 is a block diagram illustrating a semiconductor system in accordance with examples of embodiments.

FIG. 1 is a block diagram illustrating a semiconductor system in accordance with examples of embodiments.

Referring to FIG. 1, a semiconductor system 100 of this example of an embodiment may include a processor 110, a controller 200 and a memory device 300. In some embodiments the memory device 300 may be a resistance changeable memory device, etc. In other embodiments, the memory device 300 may be a memory device other than a resistance changeable memory device.

The processor 110 may be connected with the controller 200 through a plurality of bus lines 105. The processor 110 may provide the controller 200 with memory access requests including a memory address and data such as a read request, a write request, etc., through the bus lines 105. The processor 110 may receive read data from the controller 200.

The controller 200 may provide the semiconductor memory device 300 with commands CMD such as a read command, a write command, etc., an address ADD, data DATA and a control signal CTRL for driving the semiconductor memory device 300. The controller 200 may store and/or read the data in/from the semiconductor memory device 300 in response to the read command and the write command. The controller 200 may include a counting circuit block 230. The counting circuit block 230 may count access numbers of signal lines such as word lines and bit lines connected with a selected memory cell.

The resistance changeable memory device 300 may include a memory cell array 310 and a control circuit block 320. A plurality of the resistance changeable memory devices 300 may be arranged in the semiconductor system 100. The resistance changeable memory devices 300 may be simultaneously controlled by the controller 200.

Figure 2:
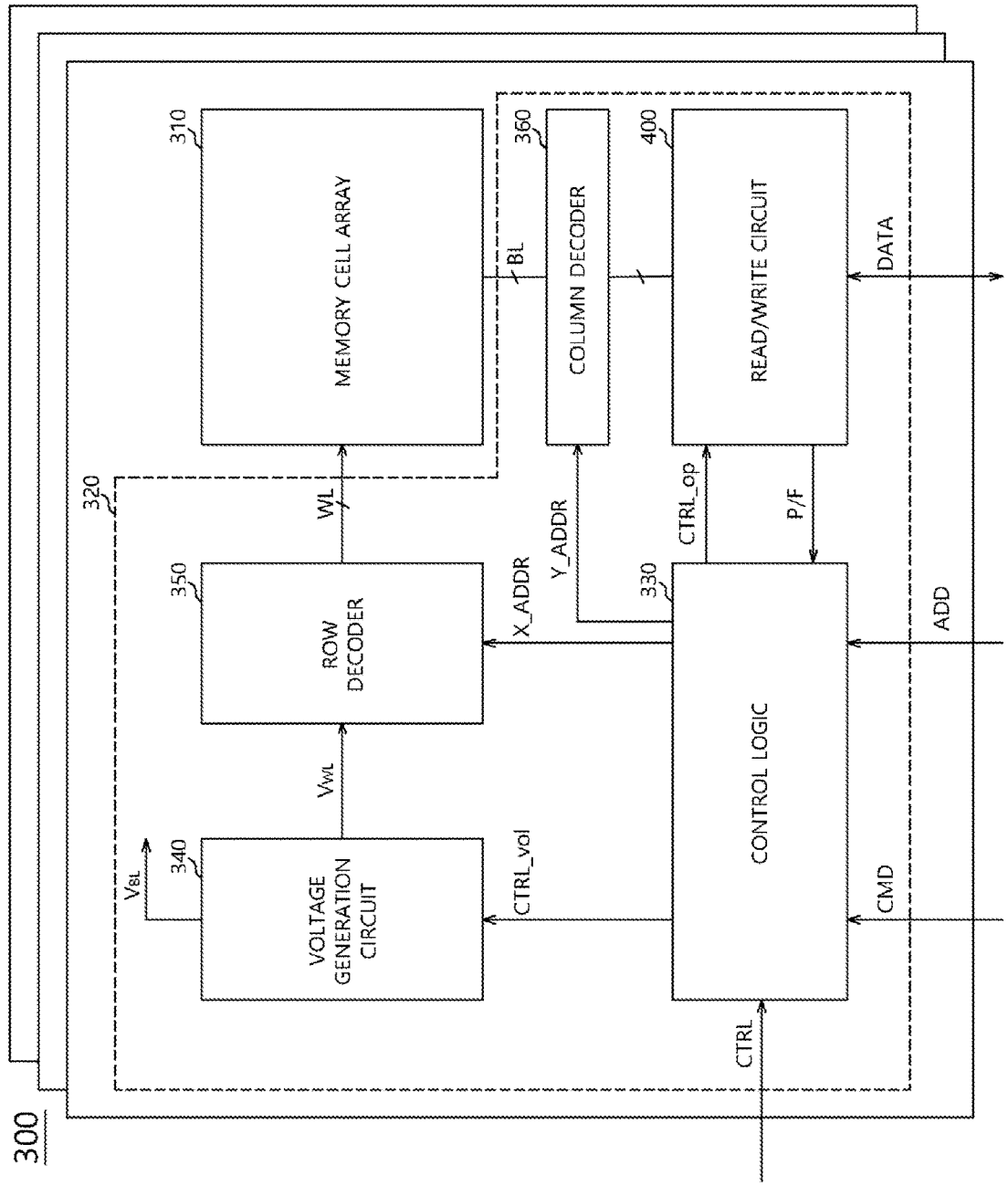
FIG. 2 is a block diagram illustrating a memory device of the semiconductor system in FIG. 1.

FIG. 2 is a block diagram illustrating a memory device of the semiconductor system in FIG. 1.

Referring to FIG. 2, each of the resistance changeable memory devices 300 may be interfaced with the controller 200.

As above, each resistance changeable memory device may include a plurality of memory cell arrays 310. Further, the plurality of memory cell arrays may be stacked. Each memory cell array 310 may include a plurality of first signal lines, a plurality of second signal lines and a plurality of memory cells connected between the first signal lines and the second signal lines. For example, the first signal lines may correspond to bit lines and the second signal lines may correspond to word lines. Alternatively, the first signal lines may correspond to word lines and the second signal lines may correspond to bit lines.

Figure 3:
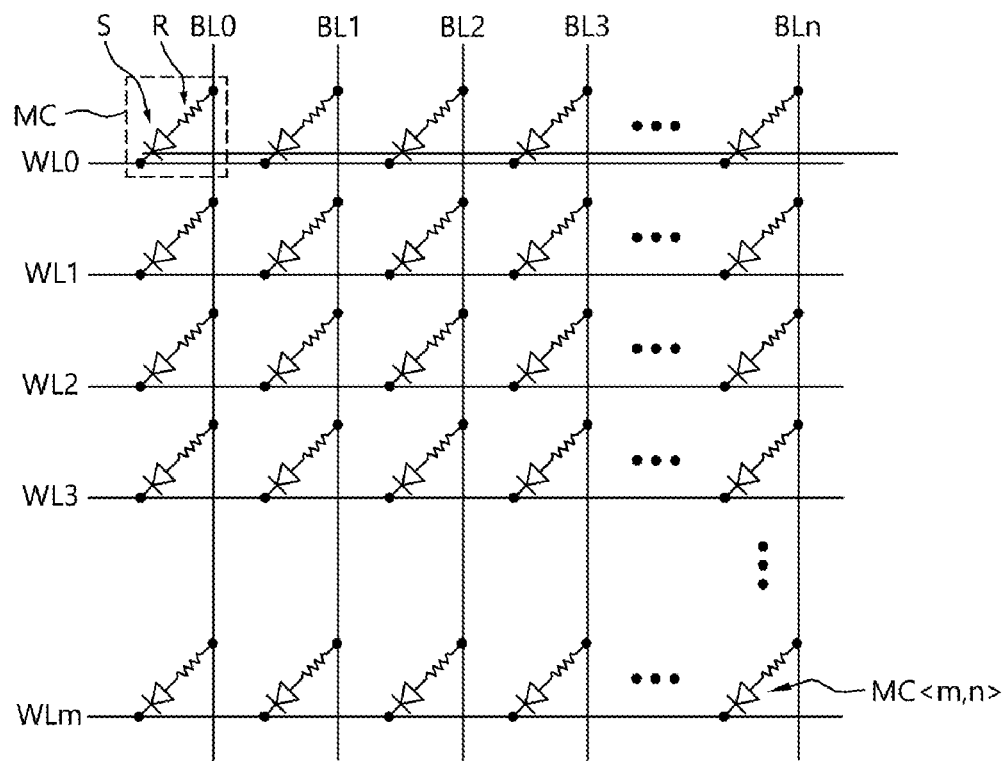
FIG. 3 is a circuit diagram illustrating a memory cell array of the memory device in FIG. 2.

FIG. 3 is a circuit diagram illustrating a memory cell array of the memory device in FIG. 2.

Referring to FIG. 3, the memory cell array 310 may include the word lines WL0~WLm, the bit lines BL0~BLn and the memory cells MC. Numbers of the word lines WL, the bit lines BL and the memory cells MC may be changed in accordance with an integration degree of the memory device. In an embodiment, 'm' may be a natural number and 'n' may be a natural number.

The memory cells MC may be arranged at intersected points between the word lines WL0~WLm and the bit lines BL0~BLn.

Each of the memory cells MC may include a selection element S and a variable resistance R. The selection element S may be connected between the word line WL and the variable resistance R. The variable resistance R may be connected with the selection element S and the bit line BL. The selection element S may control a current supplied to the variable resistance R in accordance with a difference of voltages applied to the word line WL and the bit line BL. In examples of embodiments, the selection element S may include a diode or a MOS transistor. Further, the selection element S may include an Ovonic threshold switch (OTS) including a phase changeable memory layer. The variable resistance R of the memory cell R may have resistance state changed by a current or a voltage applied to the bit line BL. For example, the variable resistance R may include a phase changeable layer having crystalline state changed by a current amount or a resistance changeable layer. The phase changeable layer may include GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), $Te_{81}Ge_{15}Sb_2S_2$, etc.

The memory cell MC may be a single level cell for storing one bit of data. In this case, the memory cell MC may have two resistance distributions in accordance with stored data. Alternatively, the memory cell MC may be a multi level cell for storing at least two bits of data. In this case, the memory cell MC may have four or eight resistance distributions in accordance with stored data.

Figure 4:
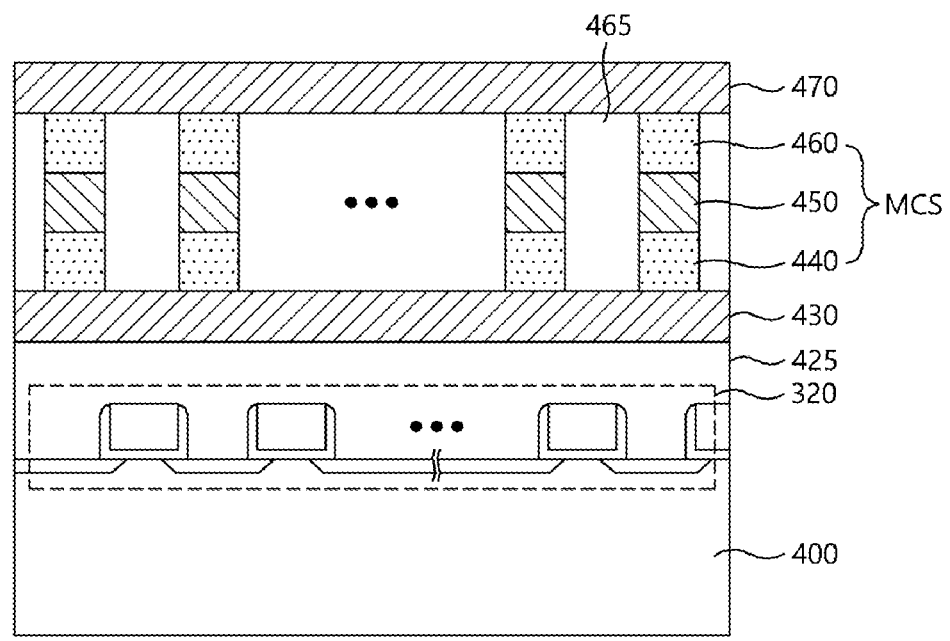
FIG. 4 is a cross-sectional view illustrating a stacked memory cell structure in accordance with examples of embodiments.

FIG. 4 is a cross-sectional view illustrating a stacked memory cell array structure in accordance with examples of embodiments.

As mentioned above, the resistance changeable memory device may have a stack structure for increasing an integration degree. Because the memory cells in a cross point memory device may be arranged at the intersected points between the word lines and the bit lines, the word lines and the bit lines may be alternately stacked to form a stack type memory device.

Referring to FIG. 4, circuit elements may be formed on a semiconductor substrate 400 to form the control circuit block 320 in FIG. 2. The circuit elements may include MOS transistors. A first insulating interlayer 425 may be formed on the control circuit block 320.

A first word line 430 may be formed on the first insulating interlayer 425. The first word line 430 may be extended in an x-direction. A first phase changeable memory layer 440, a conductive layer and a second phase changeable memory layer 460 may be sequentially formed on the first word line 430. The second phase changeable memory layer 460, the conductive layer and the first phase changeable memory layer 440 may be patterned in a y-direction substantially perpendicular to the x-direction to form a bit line 450. The first phase changeable memory layer 440 and the second phase changeable memory layer 460 may also be patterned in the y-direction to form a memory cell structure MCS. The memory cell structure MCS may also include the bit line 450.

Here, the resistance changeable memory device 300, for example, the phase changeable memory device may be arranged over the control circuit block in view of characteristics of the phase changeable memory layer. Because the phase changeable memory layer may have resistance characteristics changed in accordance with temperatures, the phase changeable memory device may be arranged on the control circuit block to reduce temperature influence of the phase changeable memory device.

A second insulating interlayer 465 may be formed between the memory cell structures MCS including the first phase changeable memory layer 440, the bit line 450 and the second phase changeable layer 460 to electrically isolate the memory cell structures MCS from each other. The second insulating interlayer 465 may be planarized to provide the second insulating interlayer 465 with a thickness substantially the same as that of the second phase changeable memory layer 460. A second word line 470 may be formed on the second insulating interlayer 465 and the second phase changeable memory layer 460. The second word line 470 may be extended in the x-direction substantially parallel to an extending direction of the first word line 430.

Therefore, a first level of memory cells (hereinafter, referred to as a first deck) may be defined on the control circuit block 320 by the first word line 430, the first phase changeable memory layer 440 and the bit line 450. A second level of memory cells (hereinafter, referred to as a second deck) may be defined on the first level deck by the bit line 450, the second phase changeable memory layer 460 and the second word line 470.

Referring again to FIG. 2, the control circuit block 320 may include a control logic 330, a voltage generation circuit 340, a row decoder 350, a column decoder 360 and a read/write circuit 400.

The control logic 330 may generate control signals CTRL_op for reading/writing the data DATA from/to the memory cell array 310 based on the command CMD, the address ADD and the control signal CTRL from the controller 200. The control signals CTRL_op may be transmitted to the read/write circuit 400, the voltage generation circuit 340, the row decoder 350 and the column decoder 360. Thus, the control logic 330 may control whole operations of the memory device 300. For example, the control signals CTRL_op may include a write enable signal, a read enable signal, a sensing enable signal, a discharge enable signal, a pre-charge enable signal, etc. The control logic 330 may provide the voltage generation circuit 340 with a voltage control signal CTRL_vol. The control logic 330 may provide the row decoder 350 with a row address X_ADDR. The control logic 330 may provide the column decoder 360 with a column address Y_ADDR.

The voltage generation circuit 340 may generate various voltages for performing a write operation, a read operation and an erase operation of the memory cell array 310 based on the voltage control signal CTRL_vol. Particularly, the voltage generation circuit 340 may generate a word line drive voltage $V_{WL}$ for driving the word lines and a bit line drive voltage $V_{BL}$ for driving the bit lines. The word line drive voltage $V_{WL}$ and/or the bit line drive voltage $V_{BA}$ may include a reset write voltage, a set write voltage, an inhibit voltage, a read voltage, a verify voltage, etc.

The row decoder 350 may activate a selected word line among the word lines WL in response to the row address X_ADD received from the control logic 330.

The column decoder 360 may activate a selected bit line among the bit lines BL in response to the column address Y_ADD received from the control logic 330.

For example, as shown in FIG. 4, in a two-deck structure, the control logic 330 of the control circuit block 320 may provide the row decoder 350 with a first row address X_ADD0 for selecting the first deck and a second row address X_ADD1 for selecting the second deck. The control logic 330 of the control circuit block 320 may provide the column decoder 360 with a first column address Y_ADD0 for selecting the first deck and a second column address Y_ADD1 for selecting the second deck.

A drift may be generated in the resistance changeable memory device 300 to change a threshold voltage Vth of the memory cell due to frequent accesses of the word lines WL0~WLm and the bit lines BL0~BLn. The controller 200 (referring to FIG. 1) of the semiconductor system 100 may include the counting circuit block 230 for counting the access numbers of the word line WL0~WLm and the bit lines BL0~BLn. When counted access numbers of the word lines WL0~WLm and the bit lines BL0~BLn may be no less than a critical value, the counting circuit block 230 may output a warning signal for driving a refresh circuit in the controller 200 to refresh a corresponding word line and a corresponding bit line.

The counting circuit block 230 may include an x-counter for counting the access numbers of the word line corresponding to the deck, and a y-counter for counting the access numbers of the bit line corresponding to the deck.

Figure 5:
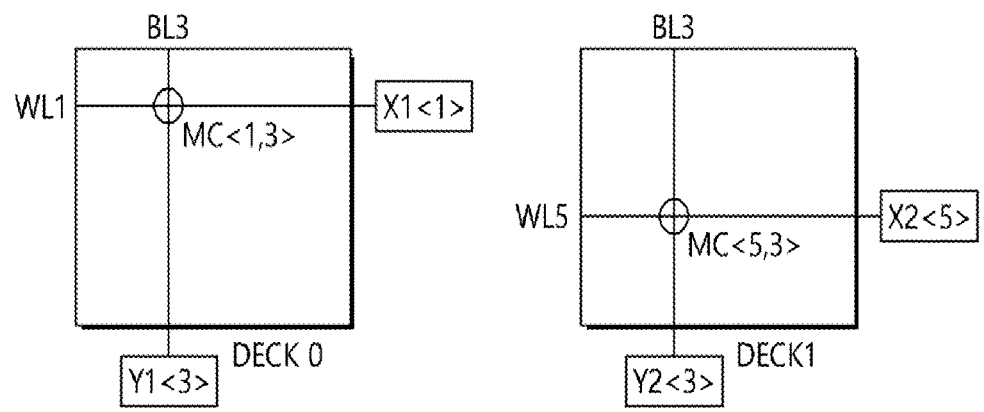
FIG. 5 is a plan view of a deck illustrating operations for selecting a memory cell.

FIG. 5 is a plan view of a deck illustrating operations for selecting a memory cell.

Referring to FIG. 5, when a data read operation or a data write operation is performed on a memory cell MC <1,3> among the memory cells of the first deck DECK 0, the second word line WL1 and the fourth bit line BL3 of the first deck DECK 0 may be selected. Thus, a second first x-counter X1<1> connected to the second word line WL1 and a fourth first y-counter Y1<3> connected to the fourth bit line BL3 may perform counting operations.

When a data read operation or a data write operation is performed on a memory cell MC <5,3> among the memory cells of the second deck DECK 1, the sixth word line WL5 and the fourth bit line BL3 of the second deck DECK 1 may be selected. Thus, a sixth second x-counter X2<5> connected to the sixth word line WL6 and a fourth second y-counter Y2<3> connected to the fourth bit line BL3 may perform counting operations.

As mentioned above, in the stacked resistance changeable memory device 300, the fourth bit line BL3 of the first deck DECK 0 and the fourth bit line BL3 of the second deck DECK 1 may be accessed. The fourth bit line BL3 may be accessed once by the deck. In contrast, because the first deck DECK 0 and the second deck DECK 1 may commonly include the fourth bit line BL3, the fourth bit line BL3 may be substantially accessed twice. Therefore, although access numbers of the first y-counter and the second y-counter may be no more than a critical value, a drift may be generated in the bit line.

Thus, in examples of embodiments, in order to count actual access numbers of the bit line, the counting circuit block 230 may be provided in the controller 200.

Figure 6:
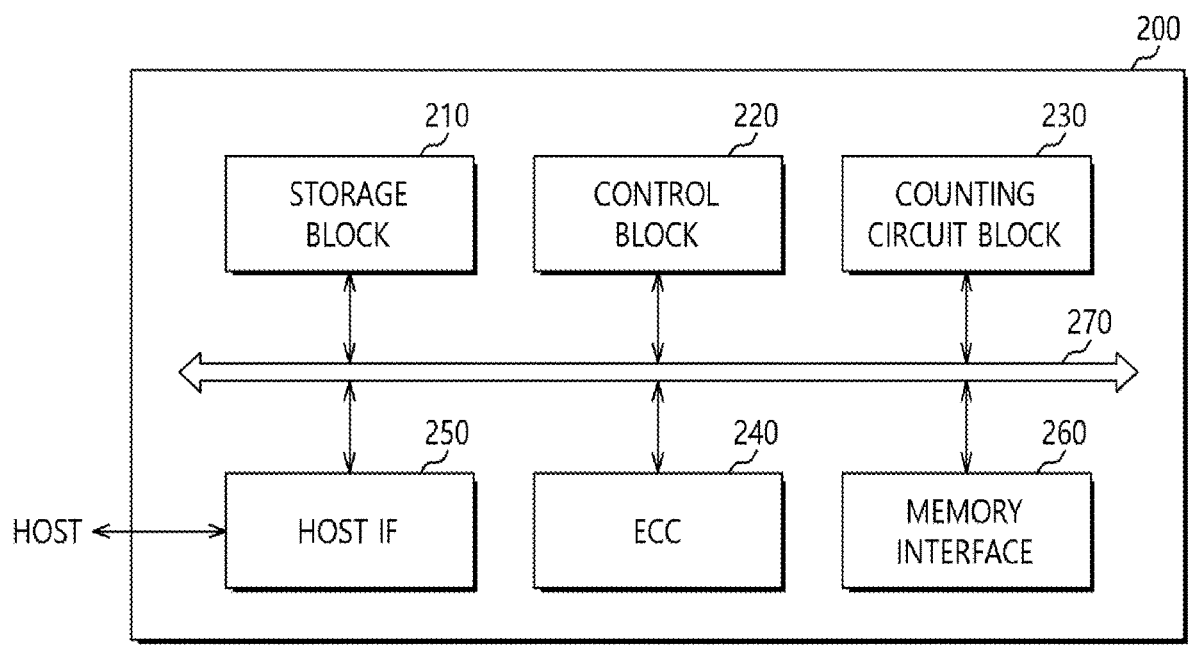
FIG. 6 is a block diagram illustrating a controller in accordance with examples of embodiments.

FIG. 6 is a block diagram illustrating a controller in accordance with examples of embodiments.

The controller 200 (i.e., memory controller) may control the memory device 300 in response to a request of a host device HOST. The memory controller 200 may provide the host device HOST with data read from the memory device 300. The memory controller 200 may store data provided from the host device HOST in the memory device 300.

The controller 200 may include a storage block 210, a control block 220, a counting circuit block 230, an error correction code (ECC) 240, a host interface 250 and a memory interface 260 connected with each other through a bus 270.

The storage block 210 may function as a working memory of the semiconductor system 100 and the memory controller 200. The storage block 210 may store data for driving the memory system 100 and the controller 200. When the controller 200 controls operations of the resistive memory device 300, the storage block 210 may store data for a read operation, a write operation, a program operation, an erase operation, etc., used by the controller 200 and the resistance changeable memory device 300. For example, the storage block 210 may include a volatile memory. The storage block 210 may include an SRAM or a DRAM. In order to store the data, the storage block 210 may include a program memory, a data memory, a write buffer, a read buffer, a map buffer, etc.

The control block 220 may control operations of the semiconductor system 100 and the read and write operations of the resistance changeable memory device 300 in response to a read request or a write request from the host device HOST. The control block 220 may drive a firmware designated as a flash translation layer (FTL) for controlling the operations of the memory system 100. For example, the FTL may perform operations such as a logical to physical (L2P) mapping, a wear leveling, a garbage collection, a bad block handing, etc. The L2P mapping may be known as a logical block addressing (LBA).

The counting circuit block 230 may count the access numbers of the word lines and the bit lines in the memory device 300.

Figure 7:
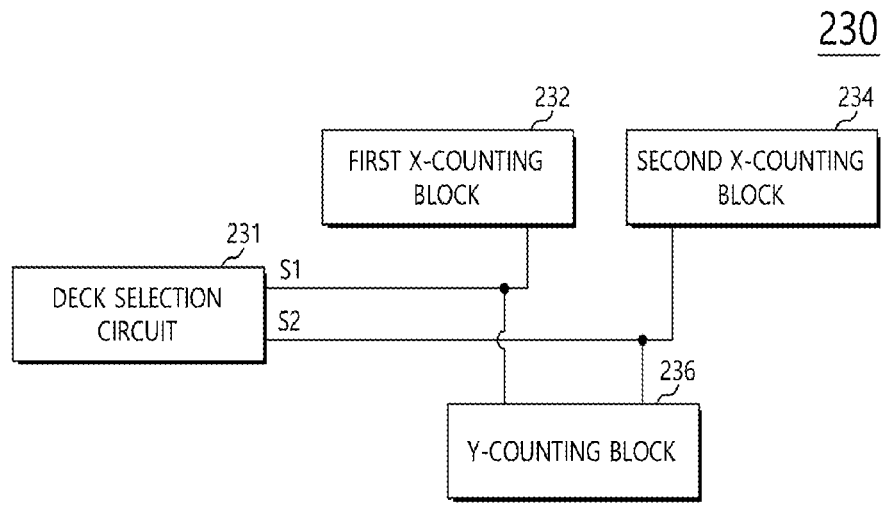
FIG. 7 is a block diagram illustrating a counting circuit block in accordance with examples of embodiments.

FIG. 7 is a block diagram illustrating a counting circuit block in accordance with examples of embodiments. FIG. 7 shows the counting circuit block for controlling the memory cell array 310 of the semiconductor memory device 300 having two decks.

Referring to FIG. 7, the counting circuit block 230 may include a deck selection circuit 231, a first x-counting block, a second x-counting block 234 and a y-counting block 236.

The deck selection circuit 231 may output a first signal S1 for selecting the first deck DECK 0 and a second signal S2 for selecting the second deck DECK 1.

The first signal S1 may be transmitted to the first x-counting block and the y-counting block 236. The second signal S2 may be transmitted to the second x-counting block 234 and the y-counting block 236.

A counter connected to a corresponding word line of the first x-counting block and a counter connected to a corresponding bit line of the common y-counting block 236 may be driven in response to the first signal S1 (i.e., a selection signal). A counter connected to a corresponding word line of the second x-counting block 234 and a counter connected to a corresponding bit line of the common y-counting block 236 may be driven in response to the second signal S2 (i.e., a selection signal).

Figure 8:
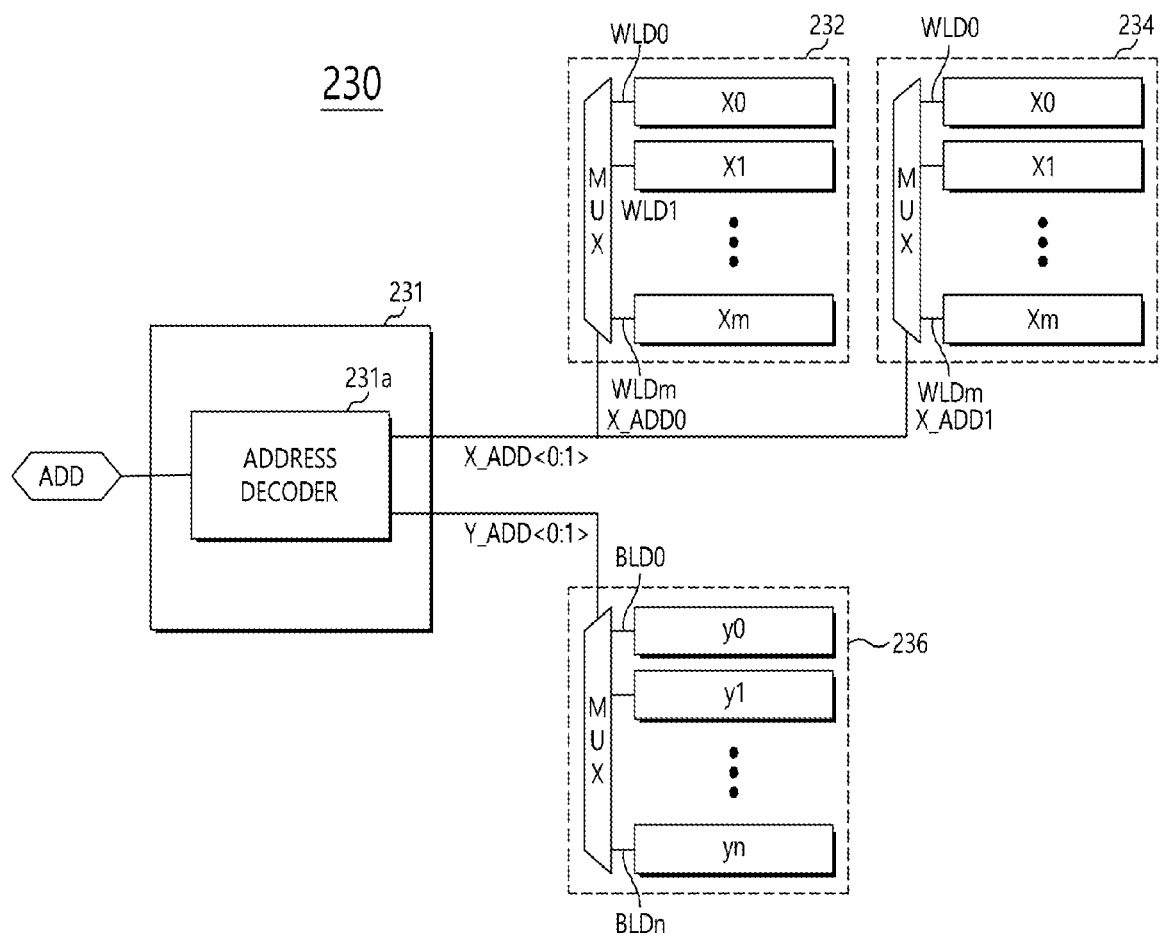
FIG. 8 is a circuit diagram illustrating a counting circuit block in accordance with examples of embodiments.

FIG. 8 is a circuit diagram illustrating a counting circuit block in accordance with examples of embodiments.

Referring to FIG. 8, the deck selection circuit 231 may include an address decoder 231a. The address decoder 231a may receive an address command ADD. The address decoder 231a may output a row address X_ADD<0:1> as the first signal S1 and a column address Y_ADD<0:1> as the second signal S2.

The first x-counting block may include a multiplexer MUX and a plurality of x-counters X0~Xm. The x-counters X0~Xm may correspond to the word lines WL0~WLm of the first deck DECK 0, respectively. For example, the x-counters X0~Xm may correspond to the word lines WL0~WLm of the first deck DECK 0 in a one-to-one manner (i.e., X0 corresponding to WL0, Xm corresponding to WLm, etc.). The multiplexer MUX may receive a first row address X_ADD0 to generate word line drive signals WLD0~WLDm for driving the word lines WL0~WLm of the first deck DECK 0. The word line drive signals WLD0~WLDm may enable word line switches connected to the word lines WL0~WLm. The x-counters X0~Xm may perform the counting operations in response to the word line drive signals WLD0~WLDm.

The second x-counting block 234 may include a multiplexer MUX and a plurality of x-counters X0~Xm. The x-counters X0~Xm may correspond to the word lines WL0~WLm of the second deck DECK 1, respectively. For example, the x-counters X0~Xm may correspond to the word lines WL0~WLm of the second deck DECK 1 in a one-to-one manner (i.e., X0 corresponding to WL0, Xm corresponding to WLm, etc.). The multiplexer MUX may receive a second row address X_ADD1 to generate word line drive signals WLD0~WLDm for driving the word lines WL0~WLm of the second deck DECK 1. The x-counters X0~Xm may perform the counting operations in response to the word line drive signals WLD0~WLDm.

The y-counting block 236 may include a multiplexer MUX and a plurality of y-counters Y0~Yn. The y-counters Y0~Yn may correspond to the bit lines BL0~BLn of the first and second decks DECK 0 and DECK 1, respectively. The multiplexer MUX may receive first and second column address Y_ADD<0:1> to generate bit line drive signals BLD0~BLDn for driving the bit lines BL0~BLn of the first and second decks DECK 0 and DECK 1. The bit line drive signals BLD0~BLDn may enable bit line switches connected to the bit lines BL0~BLn. The y-counters Y0~Yn may perform the counting operations in response to the bit line drive signals BLD0~BLDn.

The circuit including the address decoder 231a and the multiplexer may have configurations substantially the same as those of the circuit including the row decoder 350 and the column decoder 360 in FIG. 2. Thus, the word line activation signal generated from the row decoder 350 and the bit line activation signal generated from the column decoder 360 may be transmitted to the x-counters X0~Xm and the y-counters Y0~Yn, respectively.

Figure 9:
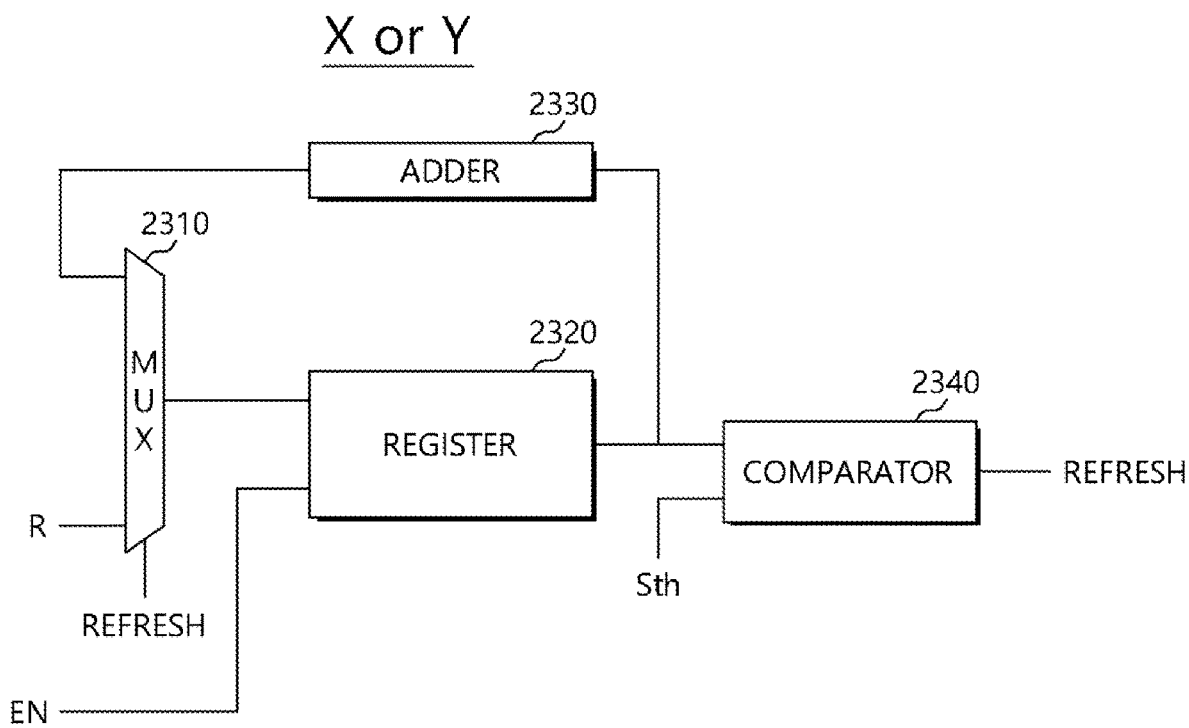
FIG. 9 is a circuit diagram illustrating a counter in accordance with examples of embodiments.

FIG. 9 is a circuit diagram illustrating a counter in accordance with examples of embodiments.

Referring to FIG. 9, the counter X or Y (i.e., counter X or counter Y) may include a multiplexer 2310, a register 2320, an adder 2330 and a comparator 2340.

An enable signal EN may correspond to the word line drive signals WLD0~WLDm or the bit line drive signals BLD0~BLDn.

The register 2320 may be selectively driven in accordance with the enable signal EN. For example, the register 2320 may include serially connected flip-flops. The register 2320 may temporarily store signals having a plurality of bits.

The adder 2330 may receive an output signal from the register 2320 to add the bit of the output signal to one bit. The comparator 2340 may compare the output signal of the register 2320 with a critical signal Sth. The critical signal Sth may correspond to a signal for representing critical numbers as a binary number. For example, when the output signal of the register 2320 may be substantially the same as the critical signal Sth, a refresh signal REFRESH may be enabled. When the refresh signal REFRESH is enabled, a refresh circuit for refreshing a corresponding word line and a corresponding bit line may be driven.

The multiplexer 2310 may receive an output signal from the adder 2330. The multiplexer 2310 may transmit the output signal of the adder 2330 or an initializing signal R to the register 2320 in response to the refresh signal REFRESH. The initializing signal R may initialize the signals inputted into the register 2320.

The y-counting block 236 may integrally count the bit lines BL0~BLn of the first and second decks DECK 0 and DECK 1. The y-counting block 236 may accumulate the access numbers of the selected bit line in the first deck DECK 0 and the access numbers of the selected bit line in the second deck DECK 1. Thus, the actual access numbers of the bit line BL may be accurately counted.

The ECC block 240 in FIG. 6 may detect and correct errors of the data read from the memory device 300. When numbers of error bits may be less than a critical number Nth of correctable error bits, the ECC block 240 may correct the errors. In contrast, when the numbers of the error bits may be equal to or more than the critical number Nth of the correctable error bits, the ECC block 240 may not correct the errors. In this case, the ECC block 240 may output an error correction fail signal for representing a correction fail of the error bits.

In examples of embodiments, the ECC block 240 may perform the error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a block coded modulation (BCM), etc. The ECC block 240 may include circuits, systems or devices for correcting the errors.

According to examples of embodiments, in the stack type resistance changeable memory device including the stacked decks, the bit line commonly in the upper and lower decks may be integrated by the single y-counting block so that the access numbers may be accumulated and counted. Therefore, the refresh timing of the accurate bit line may be properly predicted.

Further, examples of embodiments may include the stacked two decks including the single common y-counting block. Alternatively, examples of embodiments may be applied to at least three decks. In this case, the bit line commonly in adjacent decks may be counted by the common y-counting block.

Figure 10:
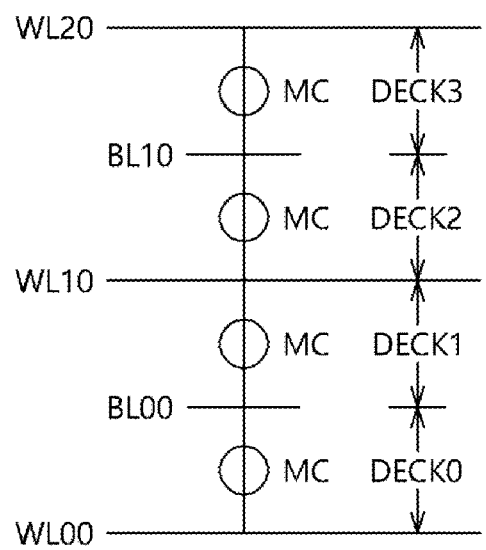
FIG. 10 is a view illustrating a four decks-stacked memory cell structure in accordance with examples of embodiments.

FIG. 10 is a view illustrating a four decks-stacked memory cell structure in accordance with examples of embodiments.

Referring to FIG. 10, the resistance changeable memory device of this example of an embodiment may include three word lines WL00, WL10 and WL20 that are stacked or, said another way, three stacked word lines WL00, WL10 and WL20. Bit lines BL00 and BL10 may be interposed between the word lines WL00, WL10 and WL20. Thus, a first deck DECK 0 may be defined by the first word line WL00 and the first bit line BL00. A second deck DECK 1 may be defined by the second word line WL10 and the first bit line BL00. A third deck DECK 2 may be defined by the second word line WL10 and the second bit line BL10. A fourth deck DECK 3 may be defined by the third word line WL20 and the second bit line BL10. FIG. 10 shows one word line and one bit line by the deck. Alternatively, the deck may include a plurality of the word lines and a plurality of bit lines. A reference numeral MC in FIG. 10 may indicate a memory cell.

Figure 11:
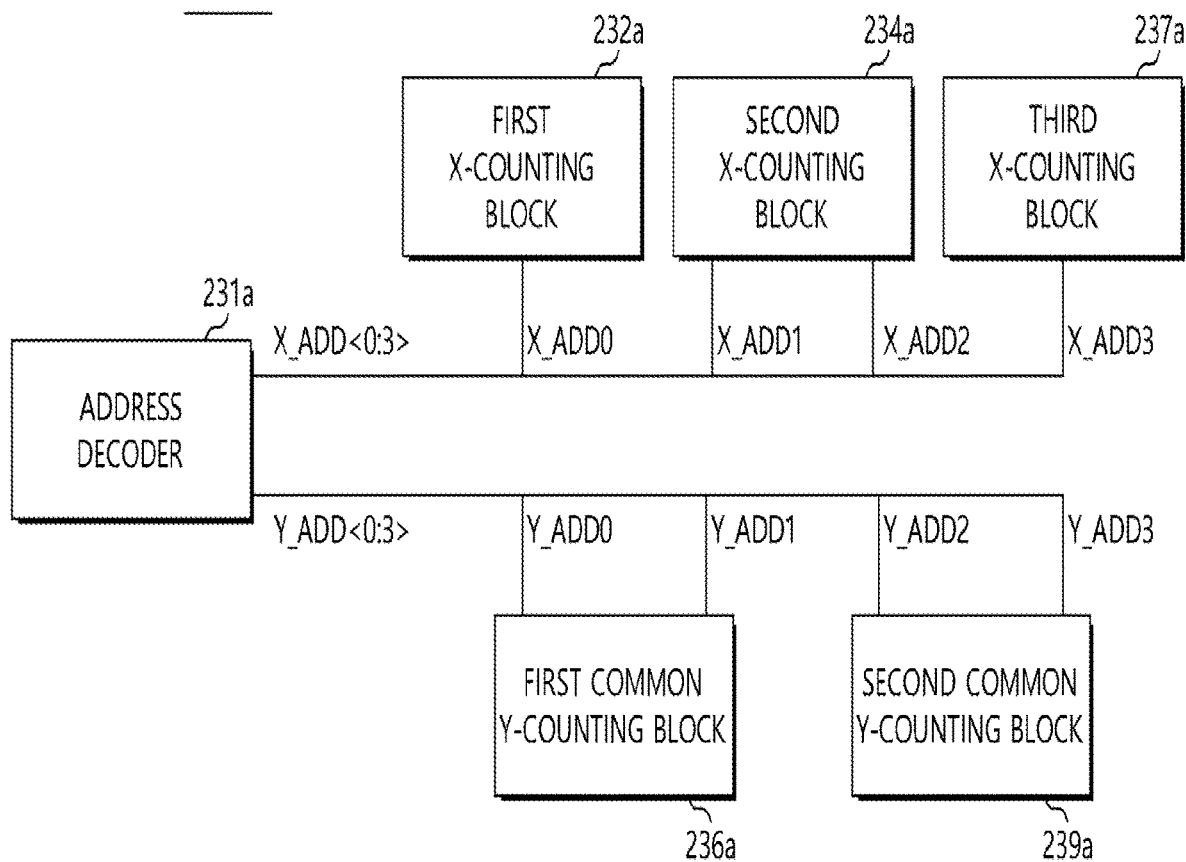
FIG. 11 is a block diagram illustrating a counting circuit block in FIG. 10.

FIG. 11 is a block diagram illustrating a counting circuit block in FIG. 10.

A counting circuit block 230a may include a first x-counting block 232a, a second x-counting block 234a, a third x-counting block 237a, a first y-counting block 236a and a second y-counting block 239a.

The first x-counting block 232a, the second x-counting block 234a and the third x-counting block 237a may have configurations substantially the same as or similar to the configurations of the counting block in FIGS. 7 and 8.

Referring to FIGS. 10 and 11, the first x-counting block 232a may count access numbers of the word lines WL00 in the first deck DECK 0. The first x-counting block 232a may include counters corresponding to the word lines WL00. The first x-counting block 232a may receive a first row address X_ADD0 for selecting the first deck DECK 0. The first x-counting block 232a may generate a signal for activating the word line WL00 to count the access numbers of the word line WL00.

The second x-counting block 234a may count access numbers of the word lines WL10 commonly shared in the second deck DECK 1 and the third deck DECK 2. The second x-counting block 234a may include counters corresponding to the word lines WL10 in the second deck DECK 1 or the third deck DECK 2. The second x-counting block 234a may receive second and third row addresses X_ADD1 and X_ADD2 for selecting the second and third first decks DECK 1 and DECK 2. The second x-counting block 234a may generate a signal for activating the word line WL10 in response to the second and third row addresses X_ADD1 and X_ADD2 to count the access numbers of the word line WL10.

The third x-counting block 237a may receive a fourth row address X_ADD3 for selecting the fourth deck DECK 3 to generate a signal for activating the word line WL20. The third x-counting block 237a may receive the fourth row address X_ADD3 of the fourth deck DECK 3. The third x-counting block 237a may generate the signal for activating the word line WL20 to count the access numbers of the word line WL20.

The first y-counting block 236a may count access numbers of the bit lines BL00 commonly shared in the first deck DECK 0 and the second deck DECK 1. The first y-counting block 236a may include counters corresponding to the bit lines BL00 in the first deck DECK 0 or the second deck DECK 1. The first y-counting block 236a may receive first and second column addresses Y_ADD0 and Y_ADD1 of the first and second decks DECK 0 and DECK 1. The first y-counting block 236a may generate a signal for activating the bit line BL00 in response to the first and second column addresses Y_ADD0 and Y_ADD1 to count the access numbers of the bit line BL00.

The second y-counting block 239a may count access numbers of the bit lines BL10 commonly shared in the third deck DECK 2 and the fourth deck DECK 3. The second y-counting block 239a may include counters corresponding to the bit lines BL10 in the third deck DECK 2 or the fourth deck DECK 3. The second y-counting block 239a may receive third and fourth column addresses Y_ADD2 and Y_ADD3 of the third and fourth decks DECK 2 and DECK 3. The second y-counting block 239a may generate a signal for activating the bit line BL10 in response to the third and fourth column addresses Y_ADD2 and Y_ADD3 to count the access numbers of the bit line BL10.

According to examples of embodiments, in the resistance changeable memory device having the four deck structure, the word line as well as the bit line may be commonly shared in the adjacent stacked decks. Thus, when the adjacent decks commonly share the bit line or the word line, the numbers of the counting circuit blocks may correspond to stacked numbers of the actual word lines and the actual bit lines, not the numbers of the decks. Therefore, the counting circuit block may not count the access numbers of the individual decks. In contrast, the counting circuit block may integrate the adjacent stacked decks to count the access numbers of the word line and the bit line. As a result, the refresh timings of the bit line and the word line may be accurately predicted.

The above described embodiments of the present disclosure are intended to illustrate and not to limit the present disclosure. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A semiconductor system comprising:
a memory device including a plurality of decks, each of the decks including word lines and bit lines alternately stacked at least once; and
a controller for controlling a read operation and a write operation for data of the decks included in the memory device,
wherein the controller comprises a counting circuit block for counting access numbers of the word lines and the bit lines, and
wherein the counting circuit block comprises:
a plurality of x-counting blocks for counting access numbers of a selected word line in accordance with a selection signal of a corresponding deck, the x-counting blocks corresponding, in a one-to-one manner, to the word lines that are stacked; and
a plurality of y-counting blocks for counting access numbers of a selected bit line in accordance with a selection signal of a corresponding deck, the y-counting blocks corresponding, in a one-to-one manner, to the bit lines that are stacked, and
wherein the plurality of x-counting blocks are provided as many times as the number of stacks of word lines.

2. The semiconductor system of claim 1, wherein the x-counting blocks count the access numbers of the word lines in a single deck in accordance with a selection signal of the single deck, and the x-counting blocks integrally count the access numbers of the word lines commonly shared by adjacent decks in response to a selection signal for the commonly shared word lines of the two adjacent decks.

3. The semiconductor system of claim 1, wherein the selection signals of the corresponding decks comprises at least one of a row address signal and a column address signal.

4. The semiconductor system of claim 1, wherein the x-counting blocks comprise a multiplexer for generating a word line activation signal of the corresponding deck in accordance with a row address signal of the corresponding deck, and the x-counting blocks comprise counters configured to receive the word line activation signals from the multiplexer for the corresponding decks.

5. The semiconductor system of claim 1, wherein the y-counting blocks integrally count the access numbers of the bit lines commonly shared by adjacent decks in response to a selection signal for the commonly shared bit lines of the two adjacent decks.

6. The semiconductor system of claim 1, wherein each of the y-counting blocks comprises counters corresponding to numbers of the bit line of the decks.

7. The semiconductor system of claim 1, wherein the y-counting blocks comprise a multiplexer for generating a bit line activation signal in response to a selection signal of two adjacent decks that commonly share a bit line, and the y-counting blocks comprise counters configured to receive the bit line activation signal from the multiplexer.

8. The semiconductor system of claim 1, wherein the counting circuit block outputs a warning signal for refreshing a corresponding word line and a corresponding bit line when the access numbers of the word lines and the bit lines are no less than a critical value.

9. The semiconductor system of claim 1, wherein the number of y-counting blocks is one less than the number of the x-counting blocks.

10. The semiconductor system of claim 1, wherein the plurality of x-counting blocks count the access numbers of the word lines in response to a one deck selection signal when the word line is included in one deck, and the x-counting blocks accumulate and count the access numbers of the word lines in response to the two deck selection signals when the word line is shared in common by two adjacent decks.

11. A semiconductor system comprising:
a first deck including a plurality of first word lines, a plurality of first bit lines and a plurality of memory cells arranged at intersected points between the first word lines and the first bit lines;
a second deck arranged over the first deck, the second deck including the first bit lines, a plurality of second word lines and a plurality of memory cells arranged at intersected points between the first bit lines and the second word lines;
a counting circuit block including a first x-counting block for counting access numbers of the first word lines in response to a first selection signal for selecting the first deck, a second x-counting block for counting access numbers of the second word lines in response to a second selection signal for selecting the second deck, and a y-counting block for counting access numbers of the first bit lines in response to the first and second selection signals,
wherein the y-counting block comprises:
a multiplexer for generating a bit line activation signal by receiving the first and second selection signals; and
a plurality of third counters driven in response to the bit line activation signal,
wherein the number of third counters correspond to the number of the bit lines.

12. The semiconductor system of claim 11, wherein the counting circuit block further comprises a deck selection circuit for generating the first and second selection signals.

13. The semiconductor system of claim 12, wherein the deck selection circuit comprises an address decoder for generating a row address and a column address from an address command.

14. The semiconductor system of claim 11, wherein the first x-counting block comprises:
a multiplexer for generating a first word line activation signal by receiving the first selection signal; and
a plurality of first counters for performing counting operations in response to the first word line activation signal,
wherein the number of first counters correspond to the number of the first word lines.

15. The semiconductor system of claim 11, wherein the second x-counting block comprises:
a multiplexer for generating a second word line activation signal by receiving the second selection signal; and a plurality of second counters for performing counting operations in response to the second word line activation signal, wherein the number of second counters correspond to the number of the second word lines.

16. A counting circuit block comprising:

a plurality of x-counting blocks including x-counters, the x-counters corresponding in a one-to-one manner to word lines that are stacked; and a plurality of y-counting blocks including y-counters, the y-counters corresponding in a one-to-one manner to bit lines that are stacked with the word lines and interposed between the word lines, wherein the y-counting blocks accumulate and count the access numbers of the bit lines in response to two deck selection signals when the bit line is commonly included in adjacent decks, wherein the x-counting blocks count the access numbers of the word lines in response to a one deck selection signal when the word line is included in one deck, and the x-counting blocks accumulate and count the access numbers of the word lines in response to the two deck selection signals when the word line is commonly shared by two adjacent decks.

17. The counting circuit block of claim 16, wherein the counting circuit block outputs a warning signal for refreshing the word line connected to any one of the x-counters when counted numbers of any one of the x-counters are no less than critical numbers.

18. The counting circuit block of claim 16, wherein counting circuit block outputs a warning signal for refreshing the bit line connected to any one of the y-counters when counted numbers of any one of the y-counters are no less than a critical numbers.

19. The counting circuit block of claim 16, wherein the selection signal comprises at least one of a row address signal and a column address signal of a corresponding deck.

* * * * *